United States Patent [19]
Amerasekera et al.

[11] Patent Number: 6,078,083
[45] Date of Patent: *Jun. 20, 2000

[54] ESD PROTECTION CIRCUIT FOR DUAL 3V/5V SUPPLY DEVICES USING SINGLE THICKNESS GATE OXIDES

[75] Inventors: Ekanayake Ajith Amerasekera; Charvaka Duvvury, both of Plano, Tex.

[73] Assignee: Texas Instruments Incorporated, Dallas, Tex.

[ * ] Notice: Under 35 U.S.C. 154(b), the term of this patent shall be extended for 944 days.

[21] Appl. No.: 08/515,752

[22] Filed: Aug. 16, 1995

Related U.S. Application Data

[63] Continuation of application No. 08/242,925, May 16, 1994, abandoned.

[51] Int. Cl.[7] .................................................. H01L 23/62
[52] U.S. Cl. ..................... 257/358; 257/360; 257/361; 257/363
[58] Field of Search ................................. 257/173, 357, 257/358, 360, 361, 362, 363

[56] References Cited

U.S. PATENT DOCUMENTS

| | | | |
|---|---|---|---|
| 4,786,956 | 11/1988 | Pivar ........................................ | 257/363 |
| 4,952,994 | 8/1990 | Lin . | |
| 5,208,474 | 5/1993 | Yamagata et al. ...................... | 257/360 |
| 5,270,565 | 12/1993 | Lee et al. ................................ | 257/360 |
| 5,285,069 | 2/1994 | Kaibara et al. ......................... | 257/392 |

FOREIGN PATENT DOCUMENTS

| | | | |
|---|---|---|---|
| 0257774 | 3/1988 | European Pat. Off. ............... | 257/362 |
| 0568421 | 11/1993 | European Pat. Off. ............... | 257/173 |
| 55-165682 | 12/1980 | Japan ................................... | 257/362 |
| 56-19656 | 2/1981 | Japan ................................... | 257/360 |
| 58-138074 | 8/1983 | Japan ................................... | 257/360 |
| 58-162065 | 9/1983 | Japan ................................... | 257/360 |
| 61-15373 | 1/1986 | Japan ................................... | 257/360 |
| 61-30075 | 2/1986 | Japan ................................... | 257/360 |
| 61-263255 | 11/1986 | Japan ................................... | 257/360 |
| 1-205560 | 8/1989 | Japan ................................... | 257/362 |
| 4-250661 | 9/1992 | Japan ................................... | 257/358 |
| 5-335495 | 12/1993 | Japan ................................... | 257/360 |

OTHER PUBLICATIONS

Ajith Amerasekera, S. Ping Kwok, Jerold Seitchik; "Current Transport Modeling in an Amorphous Silicon Antifuse Structure"; Apr., 1993, Materials Research Society Symp. Proc. vol. 297, pp. 999–1004.

*Primary Examiner*—Ngân V. Ngô
*Attorney, Agent, or Firm*—Robby T. Holland; Carlton H. Hoel; Frederick J. Telecky, Jr.

[57] ABSTRACT

An ESD protection circuit for dual 3V/5V supply devices. ESD protection circuit 10 comprises a switching element 12 connected between a bond pad 14 and primary protection device 16. Primary protection device 16 comprises MOS circuitry designed for 3V operation that suffers from oxide reliability problems when 5V signals are applied directly. Switching element 12 separates the primary protection device 16 from 5V signals which may appear at bond pad 14.

6 Claims, 2 Drawing Sheets

ESD PROTECTION CIRCUIT FOR DUAL 3V/ 5V SUPPLY DEVICES USING SINGLE THICKNESS GATE OXIDES

This application is a Continuation of application Ser. No. 08/242,925, filed May 16, 1994, now abandoned

FIELD OF THE INVENTION

This invention generally relates to semiconductor devices and more specifically to ESD protection circuits for dual (e.g., 3V/5V) supply devices.

BACKGROUND OF THE INVENTION

As integrated circuits (ICs) become more complicated and, as a result, denser, the metal-oxide-semiconductor (MOS) circuit elements that make up the IC must become smaller. As the size of a MOS circuit element shrinks, its operating voltage also tends to drop. In the past, the standard operating voltage of MOS circuit elements was 5V. Newer designs are using operating voltages in the 2.5 to 3.3 volt range. For compatibility, it is desirable for the newer designs to be able to withstand 5V signals. Unfortunately, technologies developed for 3V operation have thin gate oxides (on the order of 100 Å). If a thin oxide device designed for 3V operation were instead operated at 5V, the device would have accelerated wear-out due to reduced gate oxide reliability.

ESD protection circuits are typically designed with thin gate oxide devices to improve switching speed and current homogeneity. Hence, ESD protection circuits using MOS circuit elements must be designed to avoid having the oxides stressed by a 5V bond pad voltage during normal operation. At the same time, the protection circuit must turn-on and provide good ESD protection during ESD stress.

One prior art solution uses two gate oxide thicknesses. A thinner oxide is used for the internal circuitry and a thicker oxide is used for circuitry connected directly to a bond pad. Unfortunately, this adds process complexity by requiring two gate oxide formations. Thus, there is a need for ESD protection circuitry that will not be stressed during 5V operation and that minimizes process complexity.

SUMMARY OF THE INVENTION

An ESD protection circuit for dual 3V/5V supply devices is disclosed. The ESD protection circuit comprises a circuit element, such as a switching element, connected between a bond pad and a primary protection device.

In one embodiment, the switching element may comprise a lateral bipolar transistor, a MOS transistor, or a switching diode. The primary protection device may comprise any ESD protection device using MOS circuit elements such as a gate coupled device. The switching element isolates the thin oxide of the primary protection device from the bond pad. Accordingly, a 5V signal on the bond pad will not overly stress the primary protection device. However, the switching element is designed to turn-on during an ESD event, allowing the primary protection device to trigger. Once the primary protection device triggers, it provides a low resistance path to ground, thus drawing the ESD current away from the protected circuitry.

An advantage of the invention is providing an ESD protection circuit for dual supply devices.

A further advantage of the invention is providing a switching element between a bond pad and a primary ESD protection circuit to avoid accelerated wear-out of the primary ESD protection circuit when a 5V signal is applied to the bond pad These and other advantages will be apparent to those of ordinary skill in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION

The invention will be described in conjunction with an ESD protection circuit for a IC designed to operate at less than 5V, but which may be connected to both signals in the 2.5–3.3V and 5V range. For instance, a device operating at 3V and having 5V signals applied to various bond pads. However, it will be apparent to those skilled in the art that the invention applies generally to devices that may be used with dual supply voltages.

Figure 1:
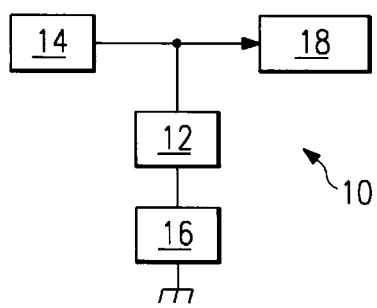
FIG. 1 is a block diagram of an ESD protection circuit according to the invention.
Figure 2:
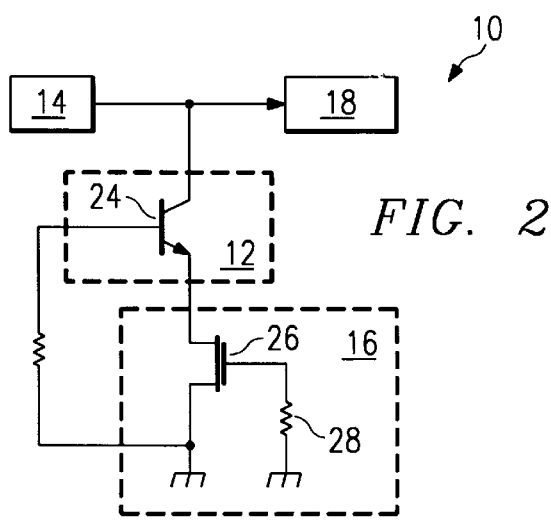
FIG. 2 is a schematic diagram of an ESD protection circuit according to a first embodiment of the invention.

An ESD protection circuit 10 according to the invention is shown in FIG. 1. A switching element 12 is connected between bond pad 14 and primary switching device 16. Primary protection device 16 is connected between switching element 12 and ground. Bond pad 14 is also connected to input/output circuitry 18. Primary switching device 16 operates to dissipate any ESD that appears at the bond pad by providing a low resistance path to ground during an ESD event. Input/output circuitry 18 is thus protected from an ESD event.

Switching element 12 may be designed such that, during normal operation (i.e., pad voltages less than or equal to 5V) the switch is an open circuit. Thus, even if a 5V signal is applied to bond pad 14, the 5V signal is not applied to primary protection device 16. Accordingly, the thin oxide of primary protection device 16 is not stressed by the use of a 5V signal. However, under ESD conditions, the switching element 12 is a closed circuit. The signal at bond pad 14 is applied to primary protection device 16. Accordingly, primary protection device 16 triggers, or turns on, and prevents the ESD signal from damaging input/output circuitry 18. It is desirable for switching element 12 to switch from an open circuit to a closed circuit at a voltage greater than 5V and less than or equal to the trigger voltage of primary protection device 16. Alternatively, switching element 12 may be designed to be a closed circuit throughout operation as will be described further hereinbelow.

The embodiments of the invention will be described in conjunction with a gate-coupled device as the primary protection device. The invention is equally applicable to other types of ESD protection devices having MOS circuitry including low voltage SCRs, gate-coupled SCR, etc.

Figure 3:
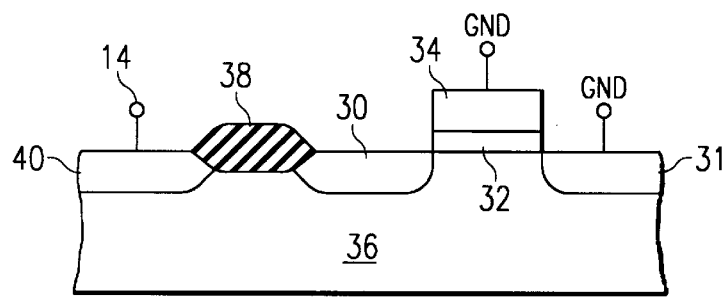
FIG. 3 is a cross-sectional view of the ESD protection circuit of FIG. 2.

A first embodiment of the invention is shown in FIGS. 2, 3, and 4a–b. Switching device 12 comprises a lateral bipolar transistor 24. Primary protection device 16 comprises a MOS transistor 26 (and its associated parasitic bipolar transistor) having its gate tied through a resistor 28 to ground. This is known as a gate coupled device. As shown in FIG. 3, MOS transistor 26 comprises source/drain regions 30, 31 and a gate 34 separated from a surface of the substrate 36 by thin oxide 32. Lateral bipolar transistor 24 is formed by placing a doped region 40 similar to source/drain regions 30 and 31 in the surface of substrate 36 separated from source/drain region 30 by a field oxide region 38. The npn junctions of lateral bipolar transistor 24 is thus formed by doped region 40, substrate 36, and source/drain region 30.

Figure 4A:
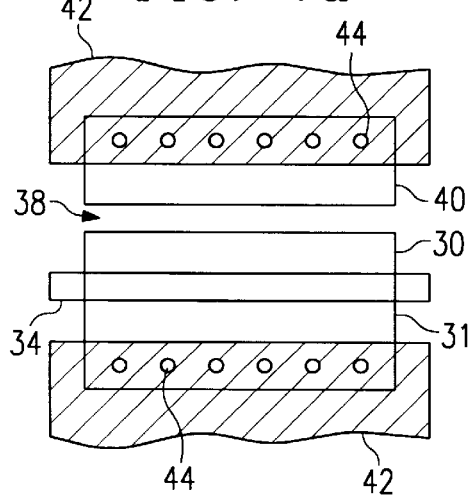
FIGS. 4a–b are top views of the ESD protection circuit of FIG. 2.

The formation of the first embodiment of the invention will be described in conjunction with FIGS. 3 and 4a–b. First, field oxide region 38 is formed according to conventional techniques at the surface of substrate 36. In the preferred embodiment, substrate 36 is p-type. However, it will be apparent to those skilled in the art that, with minor changes, an n-type substrate may alternatively be used. Field oxide region 38 has a thickness on the order of 3000 Å–5000 Å. Next, a layer of oxide is formed over the surface of the structure by, for example, thermal oxidation to a thickness on the order of 100 Å. This is followed by the deposition of conductive material such as polysilicon to a thickness on the order of 2000–4000 Å. The polysilicon and oxide layers are then etched to form gate 34 and gate oxide 32 therebelow. At this point, lightly doped drain regions and sidewall oxides (not shown) may be formed if desired as is well known in the art.

Source/drain regions 30 and 31 and doped region 40 are formed by implantation and diffusion of a n-type dopant such as phosphorous and/or arsenic. Methods for accomplishing this are well known in the art and dopant concentration levels may vary by design. Interconnects are formed next according to conventional techniques. For example, an interlevel dielectric layer (not shown) may be deposited and planarized if desired. Contacts 44 may be formed through the interlevel dielectric layer. Finally, a metal 42 may be deposited patterned and etched to connect doped region 40 to bond pad 14 and source/drain region 31 to ground.

Figure 4B:
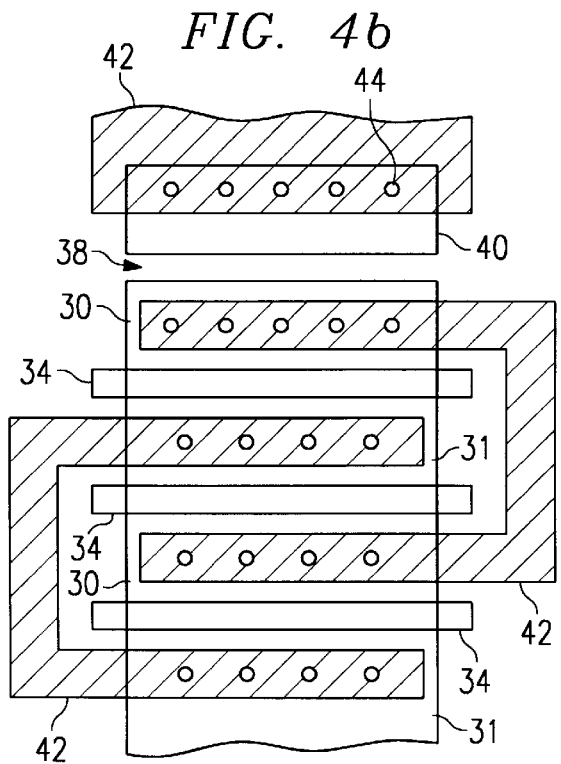

It should be noted that the primary protection device 16 may be laid out in a multi-finger configuration as shown in FIG. 4b. One lateral bipolar transistor 24 may be formed for every 5 or so fingers.

As described above, in normal operation, switching element 12 is an open circuit. However, during an ESD event, doped region 40 goes into breakdown injecting holes into the substrate 36. This switches or turns on lateral bipolar transistor 24 forming a conductive path between doped region 40 and source/drain region 30. Source/drain region 30 is thus coupled to the bond pad 14 and the ESD event. The primary protection device 16 now operates as it normally would. When it sees the ESD event, the parasitic bipolar transistor between source/drain regions 30 and 31 triggers providing a low resistance path to ground for the ESD current. It is also possible to couple region 30 to region 40 during an ESD event by mailing the distance L small enough that punch-through occurs at voltages substantially above 5V. This would then allow primary protection device 16 to trigger and provide a low resistance path to ground.

Figure 5:
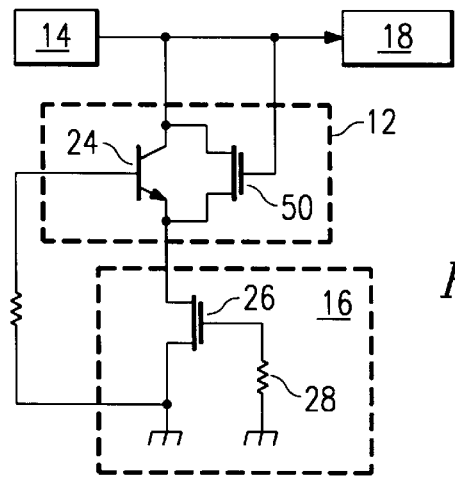
FIG. 5 is a schematic diagram of an ESD protection circuit according to a second embodiment of the invention.
Figure 6:
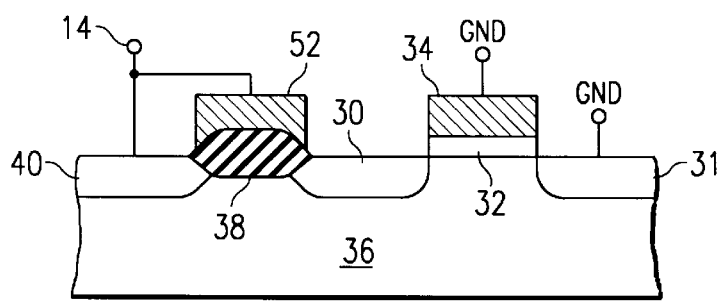
FIG. 6 is a cross-sectional view of the ESD protection circuit of FIG. 5.

A second embodiment of the invention is shown in FIGS. 5 and 6. A MOS transistor 50 is added to the first embodiment by placing a polysilicon gate 52 over field oxide region 38 and connecting it to the bond pad 14. Polysilicon gate 52 may be formed at the same time as gate 34. Because polysilicon gate 52 is separated from substrate 36 by field oxide 38 instead of a thin gate oxide, the reliability problems associated with applying a 5V signal to a thin oxide device are avoided. A metal gate could also be used.

The addition of polysilicon gate 52 enhances the operation of switching element 12. In operation, the MOS transistor 50 remains off (open circuit) as long as the voltage at the bond pad remains below the threshold voltage of transistor 50. When the bond pad voltage reaches the threshold voltage of MOS transistor 50, transistor 50 turns on and supplies current to the primary protection device 16. The threshold voltage of MOS transistor 50 is designed to be greater than the largest signal expected at the bond pad 12 (5V) and less than the trigger voltage of the primary switching device 16. When the current supplied to the primary protection device reaches the trigger level of the primary protection device 16, device 16 triggers, thus supplying a low resistance path to ground. The I/O circuitry 18 is thus protected from the ESD event.

Figure 7:
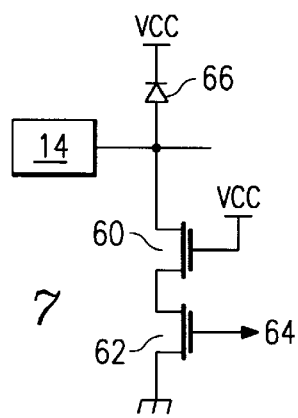
FIG. 7 is a schematic diagram of an ESD protection circuit according to a third embodiment of the invention.
Figure 8:
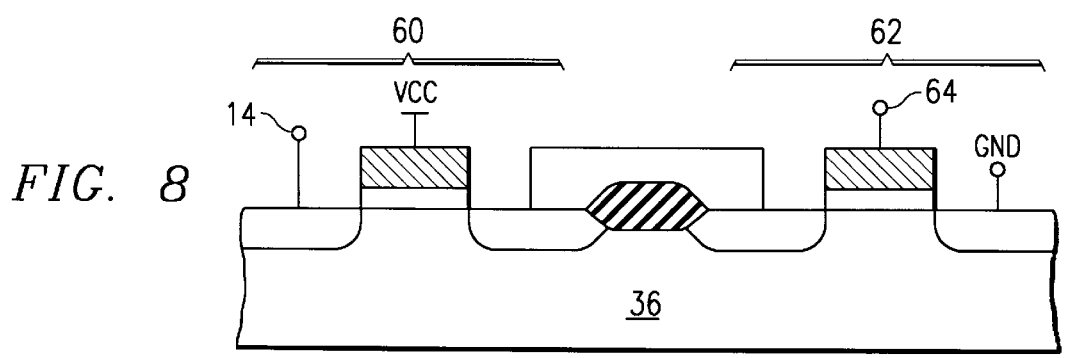
FIG. 8 is a cross-sectional view of the ESD protection circuit of FIG. 7.

A third embodiment of the invention is shown in FIGS. 7 and 8. In this case, switching element 12 is a thin oxide MOS transistor 60 having its gate tied to supply voltage Vcc. The voltage level of Vcc is approximately 3V. The drain of MOS transistor 60 is connected to the bond pad and the source is connected to MOS transistor 62. Even though MOS transistor 60 is a thin oxide device, it will not suffer the oxide stress/reliability problems discussed above if a 5V signal is applied to the bond pad because the fill 5V difference does not exist between gate and drain. With the gate tied to Vcc at 3V and the bond pad at 5V, only a 2V difference exists between the gate and drain instead of a fill 5V. If the bond pad is a 0V, there is only a 3V difference between gate and drain.

Because the gate of MOS transistor 60 is tied to Vcc, transistor 60 is always on and always provides a conductive path between bond pad 14 and MOS transistor 62. MOS transistor 62 functions as the primary protection device 16. However, in contrast to the other embodiments, the gate is connected to predriver circuitry 64. Predriver circuitry 64 is the internal circuitry for which ESD protection is desired.

In normal operation, an output signal is applied to the gate of MOS transistor 62 from predriver circuitry 64. If the output signal is high, transistor 62 will turn on, and since transistor 60 is also on, the signal at bond pad 14 is driven low. If the output signal is low, transistor 62 will not turn on and will not drive the signal at bond pad 14 low.

During an ESD event, the ESD signal will trigger the parasitic bipolar transistor associated with transistor 62 if the output signal provided to the gate of transistor 62 is low. If the output signal applied to the gate is high, the ESD signal will dissipated through MOS transistor 62 as it will be turned on. It should be noted that MOS transistor 60 is always on and provides a conductive path to MOS transistor 62.

Diode 66 as shown in FIG. 7 is optional. Diode 66 may be connected between bond pad 14 and Vcc. If diode 66 is added to the circuit, an ESD event would increase the Vcc voltage level. Because Vcc is connected to the gate of MOS transistor 60, the ESD event would increase the voltage level at both the drain and gate of MOS transistor 60. This would keep the voltage difference between gate and drain minimal and thus avoid damage to the thin oxide.

Figure 9:
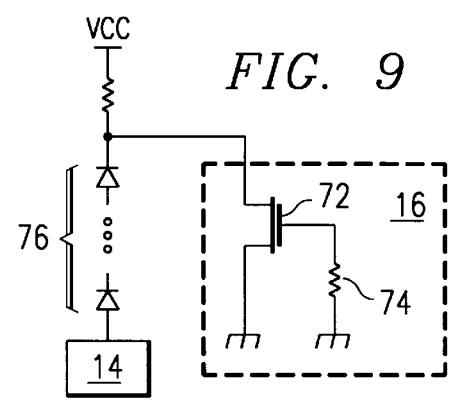
FIG. 9 is a schematic diagram of an ESD protection circuit according to a fourth embodiment of the invention.

A fourth embodiment of the invention is shown in FIG. 9. As in the first and second embodiments, a MOS transistor 72 having its gate tied through a resistor to ground is used as the primary protection device 16. Transistor 72 is a gate-coupled NMOS transistor. The switching device 12 of FIG. 1 is replaced with a stack of diodes 76 connected between the bond pad 14 and transistor 72 and a resistor 74 connected between VCC and transistor 72. Diodes 76 reduce the voltage applied to transistor 72 from bond pad 14 because the voltage level of the signal applied to bond pad 14 drops as it passes through each diode. The voltage drop across transistor 72 may thus be adjusted by tuning the stack of diodes 76 in order to meet the reliability specifications for normal operation. Accordingly, if, for example, a 5V signal is applied to bond pad 14, diodes 76 are designed such that an appropriate voltage drop occurs across the diodes 76 to leave only approximately a 3V difference occurs between the gate and drain of transistor 72.

Under ESD conditions, the voltage drop across diodes 76 is insignificant compared to the ESD. Accordingly, a sufficiently large signal from the ESD will appear at the drain of transistor 72. As in the prior embodiments, the parasitic bipolar associated with transistor 72 will then trigger providing a low resistance path to ground for the ESD current.

While this invention has been described with reference to illustrative embodiments, this description is not intended to be construed in a limiting sense.

Various modifications and combinations of the illustrative embodiments, as well as other embodiments of the invention, will be apparent to persons skilled in the art upon reference to the description. For example, the switching element of the third embodiment, MOS transistor 60, may replace the switching element in the first embodiment, lateral bipolar transistor 24 or the switching element may comprise a diode. It is therefore intended that the appended claims encompass any such modifications or embodiments.

What is claimed is:

1. An ESD protection circuit for protecting a device which has a power supply which is at a first voltage of approximately 3.3 volts and which interfaces with devices that have a supply voltage which is at a second voltage of approximately 5 volts, said ESD protection circuit comprising:

a bond pad, said bond pad subjected to said first voltage or said second voltage;

a switching element connected to said bond pad, said switching element becomes conductive upon the occurrence of an ESD event; and a primary protection device connected between said switching element and ground for dissipating an ESD signal, said primary protection device is isolated from said bond pad except during said ESD events.

2. The ESD protection circuit of claim 1, wherein said primary protection device comprises a gate-coupled device having a gate oxide on the order of 100 Å.

3. The ESD protection circuit of claim 1, wherein said switching element is a lateral bipolar transistor.

4. The ESD protection circuit of claim 1, wherein said switching element is a thick oxide MOS transistor.

5. The ESD protection circuit of claim 1, wherein said switching element is a diode.

6. The ESD protection circuit of claim 1, wherein said switching element comprises a doped region separated from said primary protection device by a field oxide region.

* * * * *